(12) United States Patent
Pickerd et al.

(10) Patent No.: US 12,265,125 B2
(45) Date of Patent: *Apr. 1, 2025

(54) SYSTEM AND METHOD FOR SEPARATION AND CLASSIFICATION OF SIGNALS USING CYCLIC LOOP IMAGES

(71) Applicant: Tektronix, Inc., Beaverton, OR (US)

(72) Inventors: John J. Pickerd, Hillsboro, OR (US); Saifee F. Jasdanwala, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 965 days.

This patent is subject to a terminal disclaimer.

(21) Appl. No.: 17/345,342

(22) Filed: Jun. 11, 2021

(65) Prior Publication Data

US 2021/0390456 A1 Dec. 16, 2021

Related U.S. Application Data

(60) Provisional application No. 63/177,930, filed on Apr. 21, 2021, provisional application No. 63/041,041, (Continued)

(51) Int. Cl.
*G01R 31/28* (2006.01)
*G01R 13/02* (2006.01)
(Continued)

(52) U.S. Cl.
CPC ... *G01R 31/31908* (2013.01); *G01R 13/0272* (2013.01); *G01R 31/31708* (2013.01); (Continued)

(58) Field of Classification Search
None
See application file for complete search history.

(56) References Cited

U.S. PATENT DOCUMENTS 4,312,238 A * 1/1982 Rey .......................... G01F 1/66
73/861.28
10,389,375 B1 * 8/2019 Fick .................... H03F 3/45183
(Continued)

FOREIGN PATENT DOCUMENTS

| CN | 103077393 | 5/2013 |
|---|---|---|
| EP | 3624113 | 3/2020 |
| KR | 10-2008-0079870 | 9/2008 |

OTHER PUBLICATIONS

Korean Intellectual Property Office, International Search Report and Written Opinion for International Application No. PCT/US2021/036973, Sep. 30, 2021, 8 pages, Daejeon, Republic of Korea.

*Primary Examiner* — Mujtaba M Chaudry
(74) *Attorney, Agent, or Firm* — Miller Nash LLP; Andrew J. Harrington

(57) ABSTRACT

A system to classify signals includes an input to receive incoming waveform data; a memory, and one or more processors configured to execute code to cause the one or more processors to: generate a ramp sweep signal from the incoming waveform data, locate a data burst in the incoming waveform data using a burst detector, receive a signal from the burst detector to cause the memory to store cyclic loop image data in the form of the incoming waveform data as y-axis data and the ramp sweep signal as x-axis data, and employ a machine learning system to receive the cyclic loop image data and classify the data burst. A method of classifying signals includes generating a ramp sweep signal from incoming waveform data, locating a data burst in the incoming waveform data, storing cyclic loop image data for the data burst in the form of the incoming waveform data as Y-axis data and the ramp sweep signal as X-axis data, and using a machine learning system to receive the cyclic loop image and classify the data burst.

21 Claims, 10 Drawing Sheets

Related U.S. Application Data filed on Jun. 18, 2020, provisional application No. 63/039,360, filed on Jun. 15, 2020, provisional application No. 63/038,040, filed on Jun. 11, 2020.

(51) Int. Cl.
*G01R 31/317* (2006.01)
*G01R 31/319* (2006.01)
*G06F 18/20* (2023.01)
*G06N 20/00* (2019.01)

(52) U.S. Cl.
CPC ....... *G01R 31/31905* (2013.01); *G06F 18/20* (2023.01); *G06N 20/00* (2019.01); *G06F 2218/16* (2023.01)

(56) References Cited

U.S. PATENT DOCUMENTS

| | | |
|---|---|---|
| 2003/0235103 A1 | 12/2003 | Raad |
| 2005/0046597 A1* | 3/2005 | Hutchison ................ G08G 1/07 340/917 |
| 2009/0199152 A1* | 8/2009 | Sjostrom ............. G03F 7/70291 430/30 |
| 2016/0047892 A1* | 2/2016 | Franceschini ......... G01S 13/003 342/60 |
| 2017/0285986 A1 | 10/2017 | Gopal |
| 2019/0187894 A1* | 6/2019 | Benisty ................ G06F 12/128 |

* cited by examiner

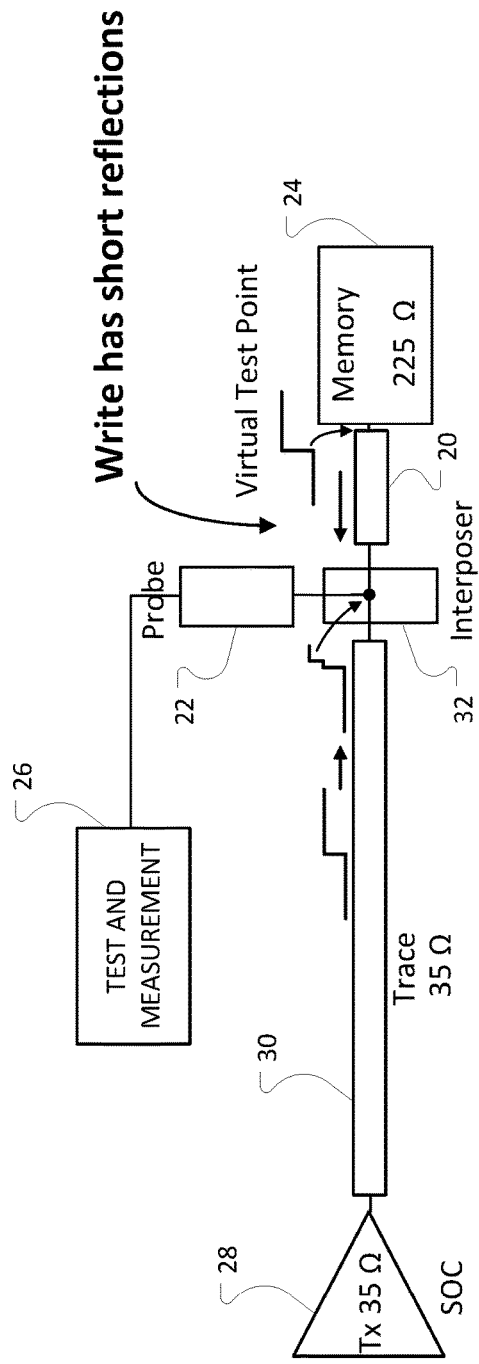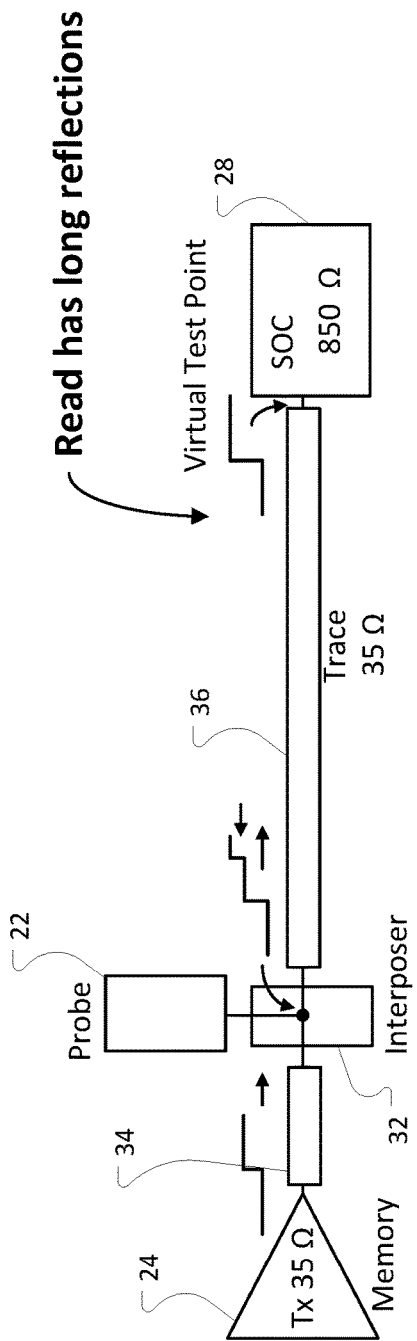
FIG. 5
FIG. 6

SYSTEM AND METHOD FOR SEPARATION AND CLASSIFICATION OF SIGNALS USING CYCLIC LOOP IMAGES

RELATED APPLICATIONS

This disclosure claims the benefit of U.S. Provisional Pat. App. No. 63/038,040, titled "PAM4 CYCLIC EYE IMAGE REPRESENTATION FOR WAVEFORM DATA," filed Jun. 11, 2020, U.S. Provisional Pat. App. No. 63/039,360, titled "READ/WRITE BURST SEPARATION AND MEASUREMENT USING NOVEL CYCLIC EYE PLOT AND MACHINE LEARNING," filed Jun. 15, 2020, U.S. Provisional Pat. App. No. 63/041,041, titled "CYCLIC EYE IMAGE REPRESENTATION FOR WAVEFORM DATA," filed Jun. 18, 2020, and U.S. Provisional Pat. App. No. 63/177,930, titled "CYCLIC EYE WITH MACHINE LEARNING FOR MEASURING OR TUNING AN OPTICAL TRANSMITTER," filed Apr. 21, 2021, each of which hereby incorporated herein by reference in their entirety.

This disclosure is related to the following patent applications: U.S. patent application Ser. No. 17/345,312, filed Jun. 11, 2021, with the title, "SYSTEM AND METHOD FOR MULTI-LEVEL SIGNAL CYCLIC LOOP IMAGE REPRESENTATIONS FOR MEASUREMENTS AND MACHINE LEARNING," and U.S. patent application Ser. No. 17/345,283, filed Jun. 11, 2021, with the title, "A CYCLIC LOOP IMAGE REPRESENTATION FOR WAVEFORM DATA".

TECHNICAL FIELD

This disclosure relates to identifying data in two-way buses, more particularly to identifying and classifying the data direction.

BACKGROUND

In some situations, identifying acquired bursts of data on two-way buses and classifying in which direction the data signal is traveling is useful. If test and measurement instruments like oscilloscopes had unlimited channels, it would provide the ability to acquire the needed command bus lines to separate read and write bursts on such bi-directional buses. However, it becomes a challenge when only one or two probes are available.

An example of such a signal is in DDR5 memory, the standard for double-data rate memory version 5 memory. This represents the next major change in computing memory increasing speed and density but keeping a similarly dimensioned DIMM (dual in-line memory module). The system channel characteristics differ significantly between read and write operations as seen at the probe point. The read signals must be processed and measured separately from the write signals, so they must be separated.

Users often use eye diagrams, so-called because the opening between two waveforms looks like an eye, to analyze signals. But, the increasing speeds of memory on the same printed circuit board (PCB) material results in waveform diagrams have "closed" eyes for write data bursts that arrive at the memory. The DDR5 DRAM supports data rates from 3200 MT/s to 6400 MT/s. This increase in the data rate is achieved without changing the signaling scheme of data pins, i.e. DQ bus is still single-ended—same as DDR3/4. However, due to the many impedance mismatched points that exists in the DDR5 channel, inter-symbol interference (ISI) due to reflections is expected to increase. At data rates of 4800 MT/s and higher, the data eye at the DRAM probe point, e.g. a solder ball, is expected to be closed. A 4-tap DFE is implemented in the DDR5 DRAM receiver to help equalize the DQ signals and mitigate this problem.

While the DIMM PCB on which the memory mounts and the size of the board has remained the same, the memories are doubling in size. In addition, oscilloscopes typically only have four channels, limiting the number of parallel data, clock, and command address lines acquirable for analysis and testing.

Typically, the DQS clock strobe signal and the DQ data signal are the most interesting for analysis. Two probes are required. A preamble occurs on the DQS signal before each data burst and this can be used for locating the beginning of bursts of read or write data. In the past, for previous DDR DRAM protocols like DDR3/DDR4, there was a phase difference between read and write bursts, meaning DQS and DQ on the write bursts were center aligned and on the read bursts were edge aligned. Also, the command bus had separate WE (Write Enable), RAS (Row Access Select), CAS (Column Address Select) signals available which were used to identify read or write bursts. However, DDR5 replaces the WE/CAS/RAS signals with a compact 14 pin Command Address (CA) bus and decoding is required to figure out read/write commands. This typically means getting access to all 14 CA pins, which is not practical. Also, there is no more distinct phase difference between DQS and DQ signals like in DDR4/DDR3. In DDR5, DQS and DQ on the write path could have a fixed offset of up to 3 UI (unit intervals) that programmed during the bootup process.

Therefore, what is needed is a method to use only data lines in order to identify whether burst signals are read or write. Embodiments of the disclosed apparatus and methods address shortcomings in the prior art.

BRIEF DESCRIPTION OF THE DRAWINGS

FIG. 5 shows a trace between a test probe and a mismatched load for a write operation.

FIG. 6 shows a trace between a test probe and a mismatched load for a read operation.

DETAILED DESCRIPTION

Embodiments of the disclosure address the problem of identifying acquired bursts of data on two-way buses and classifying which direction the data travels. For the case of DDR5 memory, oscilloscopes generally do not have channels and/or the device under test (DUT) does not have sufficient space for connecting enough probes to acquire the needed command bus lines to differentiate between read and write data bursts. However, the system channel characteristics differ significantly between read and write operations as seen at the probe point. Read signals must be processed and measured separately from write signals. The embodiments here address the need to perform this separation using only one or two probes. One aspect of the embodiments lies in the use of a unique cyclic loop image that is more sparse than a traditional eye diagram. The cyclic loop images focus more on the edges of the signals, which contain most of the information that characterizes the system response.

Figure 1:
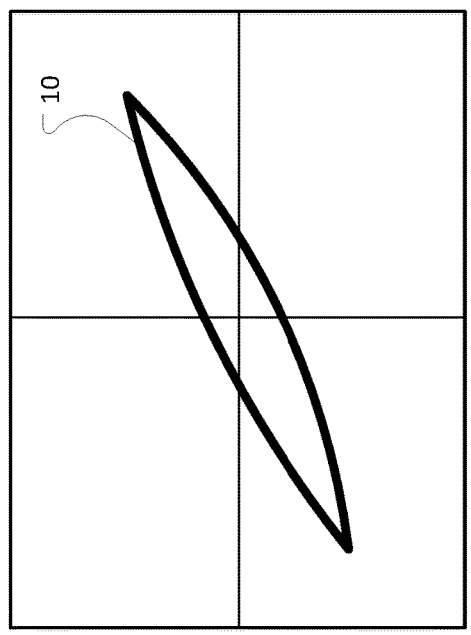
FIG. 1 shows a representation of a cyclic loop image.

The embodiments utilize an apparatus and method to create a cyclic loop image as an XY plot of the incoming signal. The cyclic loop images of the embodiments facilitate numerous measurements, and provide a simplified image suitable for using, for example, as an input to existing pre-trained neural networks or other machine learning systems for classification of read versus write in particular data bursts. Embodiments may also have applications to other binary encoded signals such as non-return-to-zero (NRZ) or multilevel signals such as pulse-amplitude-modulated signals (e.g., PAM4). The embodiments also address using the cyclic loop image coupled with machine learning in order to perform read and write separation for memory systems. FIG. 1 shows an example of a cyclic loop diagram 10.

The embodiments use a simple but robust algorithm to create an XY plot of the input signal. The vertical Y axis consists of the signal itself. For DDR5 applications, this signal would typically be either the DQ data burst signal, or the DQS data strobe clock signal. The horizontal X axis consists of a sweep signal created by processing the DQ, or the DQS, signal. This processing creates a unique linear or a somewhat linear ramp sweep signal only at edge transitions in the data pattern. No ramps occur in intervals in which the signal level does not change, e.g. long intervals of highs or long intervals of lows. This takes a unique approach that differs from a classical Lissajous figure. Embodiments automatically position these ramps such that the XY signal path is a closed loop line containing all rising edges above the upper side of the loop and all falling edges on the lower side of the loop.

Since edges in the system contain most of the information defining the system transfer function, this simple image results in a cyclic display that captures all cycles of the waveform in one image and yet it eliminates a lot of the extra unnecessary data points that a typical eye diagram would contain. The resulting plot may, depending on the waveform characteristics, have appearance similarities to magnetic hysteresis BH plots. However, there are significant differences in the aspects of the horizontal ramp creation and how they are generated and how it applies to PRBS (pseudo-random binary sequence) data pattern.

A major advantage lies in the simplicity of the implementation and its robustness. The overall approach represents several methods for creating the X axis ramp like signal. A specific embodiment discussed below regarding FIG. 8 addresses a simple process in complexity and processing speed. This approach may produce some distortion in the edge shape. For purposes of machine learning system recognition, this method will increase compute speed, while at the same time still allow the machine learning algorithm to classify it. For example, the machine learning system can classify read versus write operations in a memory system by looking only at the DQS or the DQ signal.

One should note that while the discussion below addresses classification of memory signals, embodiments are not limited to that application. No such limitation should be inferred. Embodiments may be used for other bi-directional systems where system characteristics may be different depending on the direction of signal propagation. In addition, the signals may consist of read or write data burst signals, or any binary encoded signals with two levels like non-return-to-zero (NRZ) signals, or pulse-amplitude modulated signals with more than two levels, such as PAM4.

The cyclic loop image is simplified plot that specifically shows, signal attributes such as the system response, non-linearity for rising compared to falling edges, SNR, amplitude, reflections delay, reflection coefficient, etc. The XY image created has a method of reducing the unnecessary parts of a waveform display and showing only the important attributes needed for classifying the difference between the write operation system response and the read operation response. The reduced image size and the simplified closed loop path representing the system act as ideal inputs for a pre-existing, pre-trained image processing neural network or other machine learning network or system. In addition, multiple measurements as described above can be made using the cyclic loop image.

Once the DQS and DQ bursts have been classified and separated into separate waveforms, these waveforms are amplitude as a function of time, and may be further processed with operations such as creating virtual test point filters to move the view of the actual probe point. This removes the steps from reflections of memory loads that are not matched to the transmission line. It does not actually remove the reflection, but it removes the delay from the reflections, resulting in no steps in the rising and falling edges, but the amplitude is usually increased by the reflection. In the case of DDR5, as well as other possible applications, a DFE equalizer is applied to the separated write bursts. Finally, the processed waveforms may be processed by DDR compliance application or by jitter analysis application software for further analysis.

Therefore, what is needed and addressed by the embodiments is a method to use only DQS and/or DQ data lines to identify whether burst signals are read or write. The embodiments also utilize a unique way to create a cyclic loop image, instead of the traditional eye diagram, to facilitate numerous measurements. The cyclic loop provides a simplified image suitable for input to existing pre trained neural networks for classification of read versus write signal bursts.

Figure 2:
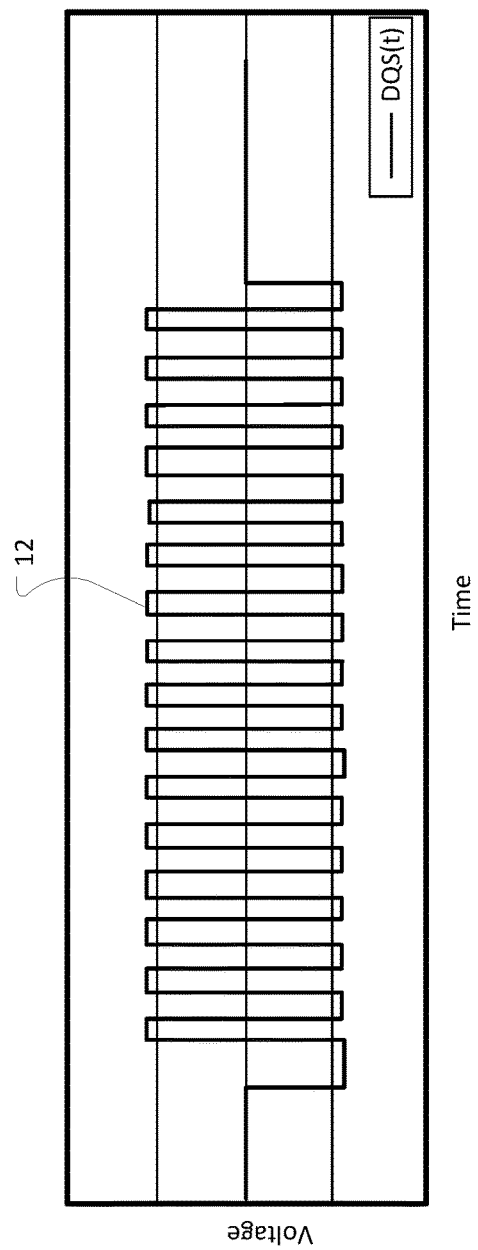
FIG. 2 shows an example of a DDR5 memory data burst signal.
Figure 3:
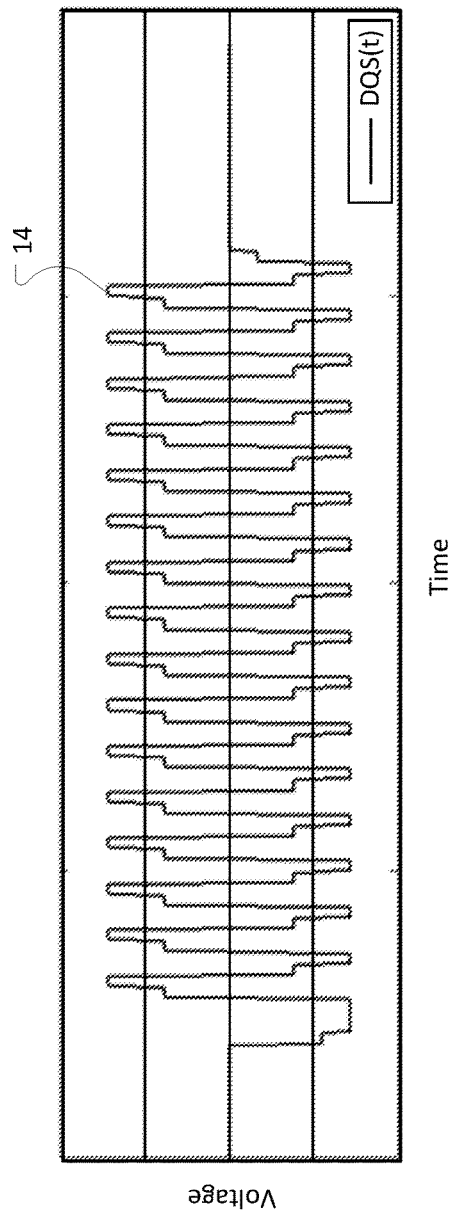
FIG. 3 shows an example of a DDR5 memory data burst signal with reflections from a mismatched load.
Figure 4:
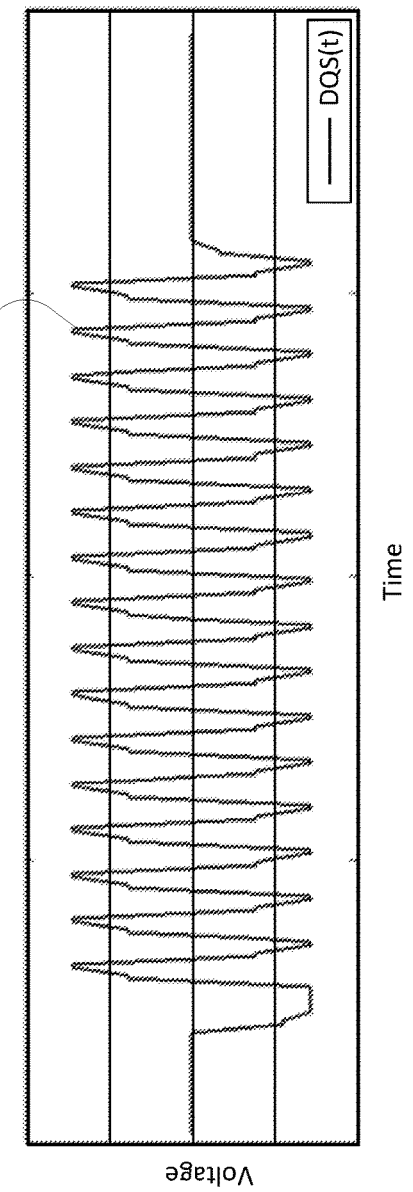
FIG. 4 shows an example of a DDR5 memory data burst signal with reflections from a mismatched load and with trace intersymbol interference (ISI) loss.

FIGS. 2-4 show examples of DQS burst signals. FIG. 2 shows an example of an ideal DQS burst signal 12 in DDR5 memory systems. FIG. 3 shows an example of a DDR5 memory DQS burst signal 14 that includes reflections from a mismatch load. FIG. 4 shows an example of a DDR5 DQS signal 16 with reflections from a mis-matched load, and with trace inter symbol interference (ISI) loss.

The system transfer function allows for distinguishing between read and write data bursts, as it typically differs between the two. The system hardware has different characteristics for read versus write operations. The loads at the ends of the transmission line may differ. The voltage amplitude at the memory transmitter may be different than that at the SOC (system on a chip) transmitter. The delay times of reflections may be different.

In addition, for many situations the probe physically connects to an interposer board mounted very close to the memory chip and far from the SOC. FIG. 5 shows a trace 20 on a device under test between probe 22 from test and measurement instrument 26 and mismatched memory load 24. Trace 20 is short with the signal observed at the probe 22 point having a large reflection. This results in a high reflection coefficient, and small delay. This results in pulse amplitude at the probe point that is larger than the incident pulse amplitude from the SOC 28. However, the long trace 30 from SOC to the probe 22 point will have loss that will cause a loss of signal amplitude from the SOC. Therefore, the trace ISI loss tends to lower the pulse amplitude at the probe point, and the memory reflection coefficient tends to increase the amplitude at that point. This occurs because the impedance of the memory load is greater than the transmission line impedance. This is the situation for typical DDR5 system probed with an interposer 32 for a write operation.

FIG. 6 shows a read operation. For this case, the memory 24 has become the transmitter. The probe 22, typically connected through the interposer 32, is only separated from the memory 24 by a short trace 34 with low loss. This makes the incident pulse at the probe 22 similar in amplitude to what the memory transmitted. The signal then travels down the long trace 36 to the SOC 28 with a large impedance mismatch which reflects some signal back to the probe 22. The long trace 36 has high loss reducing amplitude of the reflected signal. This reflected signal comes back to the probe 22 and usually increases the amplitude seen at the probe because the SOC 28 load impedance is larger than the transmission line characteristic impedance. For this case the delay time is much longer and the SOC load may be different than the memory load when it was the receiver.

The delay time of the reflection and the reflection coefficient value can be computed by doing a couple of cursor measurements on the waveform acquired by the probe 22 and test and measurement instrument 26, such as an oscilloscope. Then, if the SOC load is known, the trace impedance can be computed given the reflection coefficient and the SOC load value. Or if the trace impedance, i.e. the characteristic impedance, is known, then the SOC impedance can be computed. i.e. Using standard transmission line theory equation:

$$Z = \frac{1+\Gamma}{1-\Gamma} Z0 \qquad (1)$$

where Z is the SOC memory load and Z0 is the long trace transmission line impedance. Γ is the reflection coefficient.

Overall, for the DDR5 model example, the primary system characteristics influencing the pulse shape are: 1) the loss of the long trace which can be represented by a single parameter, a, 2) the delay of the reflections, ti, 3) the reflection coefficient, Γ, and 4) the output voltage gain constant of the transmitter, K. It appears, based on looking at several examples in the industry, that this model works reasonably well for defining a system equation that can simulate the types of waveforms observed in these systems. These parameters can be configured into a frequency domain equation shown below in equation (6). This model approximates the response of the system shown in FIGS. 5 and 6.

The first step to create a modeled transfer function, H, to model the long trace length between SOC and probe point as shown in (2).

$$H(n) = e^{-\alpha \cdot \frac{n}{N}} \qquad (2)$$

$$n = 0 \ldots N-1 \qquad (3)$$

where N is the length of the frequency domain vector in samples from DC to fs, the sample rate. The value of n is the index to various samples in the frequency domain.

Figure 7:
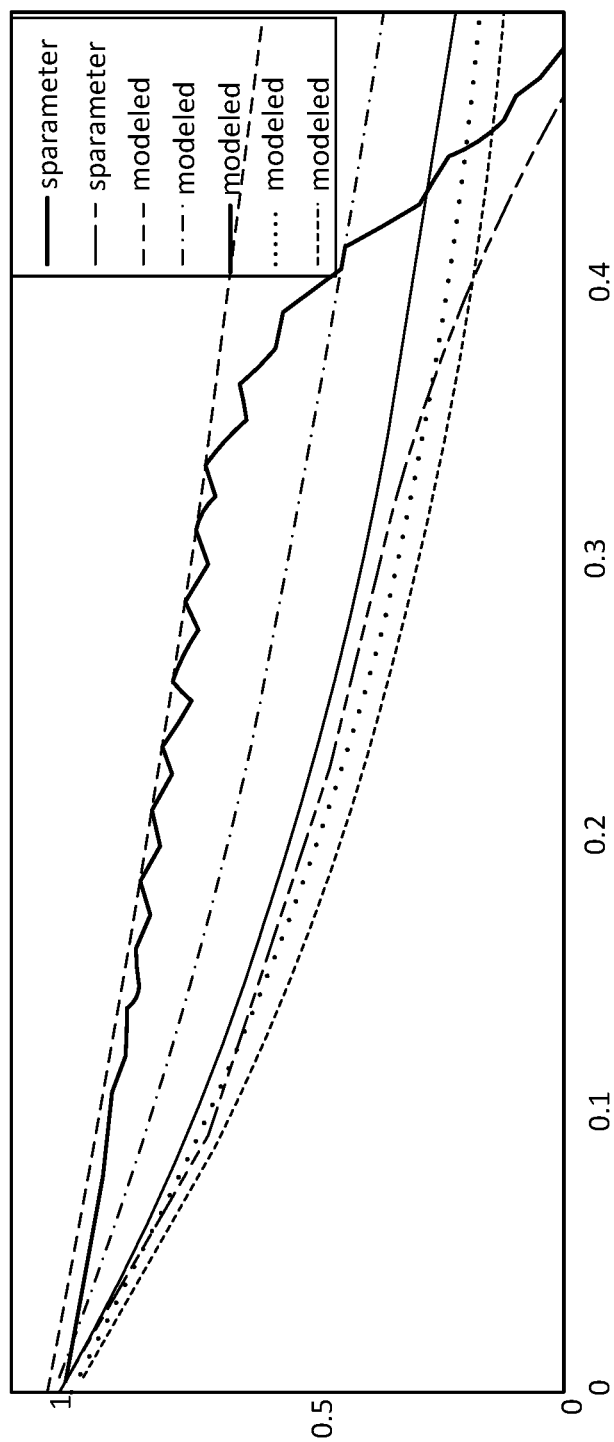
FIG. 7 shows a graph of trace loss modeled by an exponential equation compared to two actual measured traces.

The value of α is a constant that determines loss characteristic of different PCB trace lengths. The exponential term only defines the magnitude response. To assign an appropriate phase response, the minimum phase response can be obtained from (4).

$$h = \text{rceps}(ifft(H)) \qquad (4)$$

where rceps is a Matlab function that returns minimum phase impulse response of Y.

$$H = fft(h) \qquad (5)$$

where H is now the modeled minimum phase frequency response of the PCB trace from SOC to the probe point.

$$Y(n) = H(n)\left(X(n) + X(n) \cdot \Gamma \cdot e^{-j \cdot 2 \cdot \pi \cdot fs \cdot \tau \cdot \frac{n}{N}}\right) \qquad (6)$$

where fs is the sample rate in Hz and n is the frequency index, and N is the number of samples from DC to fs. Γ is the reflection coefficient, and τ is the reflection delay. The part of equation (2) with the exponent −αn/N creates the magnitude roll off that closely matches typical PCB traces as shown in FIG. 7. Therefore, α is the variable that determines which loss curve is created as shown in the plots in FIG. 7, X(n) represents the signal at the input to the model.

The previous discussion has described the system modeling and measurement issues required for DDR5 memory read versus write separation. This lays the foundation for understanding why embodiments of the disclosure are needed.

A first procedure commonly used when setting up machine learning applications is data reduction. For example, the more parameters and data inputs there are into the machine learning algorithm the more difficult it is to arrive at a unique correct solution. In addition, more input data requires more training time and more runtime processing. Therefore, a first step is to look at all the input parameters and data and determine which parameters and which data, have very little effect on the outcome. These items shall be eliminated as inputs to the system.

The discussion above presented a set of four of the most basic elements needed to understand the shape commonly seen in DDR waveforms. Those four parameters were a, which represents the long trace ISI in the model, and τ, which represents the reflection delay time, and Γ, which represents the reflection coefficient, and K, which represents an amplitude difference constant between the SOC transmission for write operations, and the memory transmission amplitude from memory for a read operation. These three parameters, excluding K, may affect ISI, inter symbol interference. The value of a represents ISI due to trace loss and the reflection coefficient and delay represents ISI due to reflections caused by load mismatch impedance.

Figure 8:
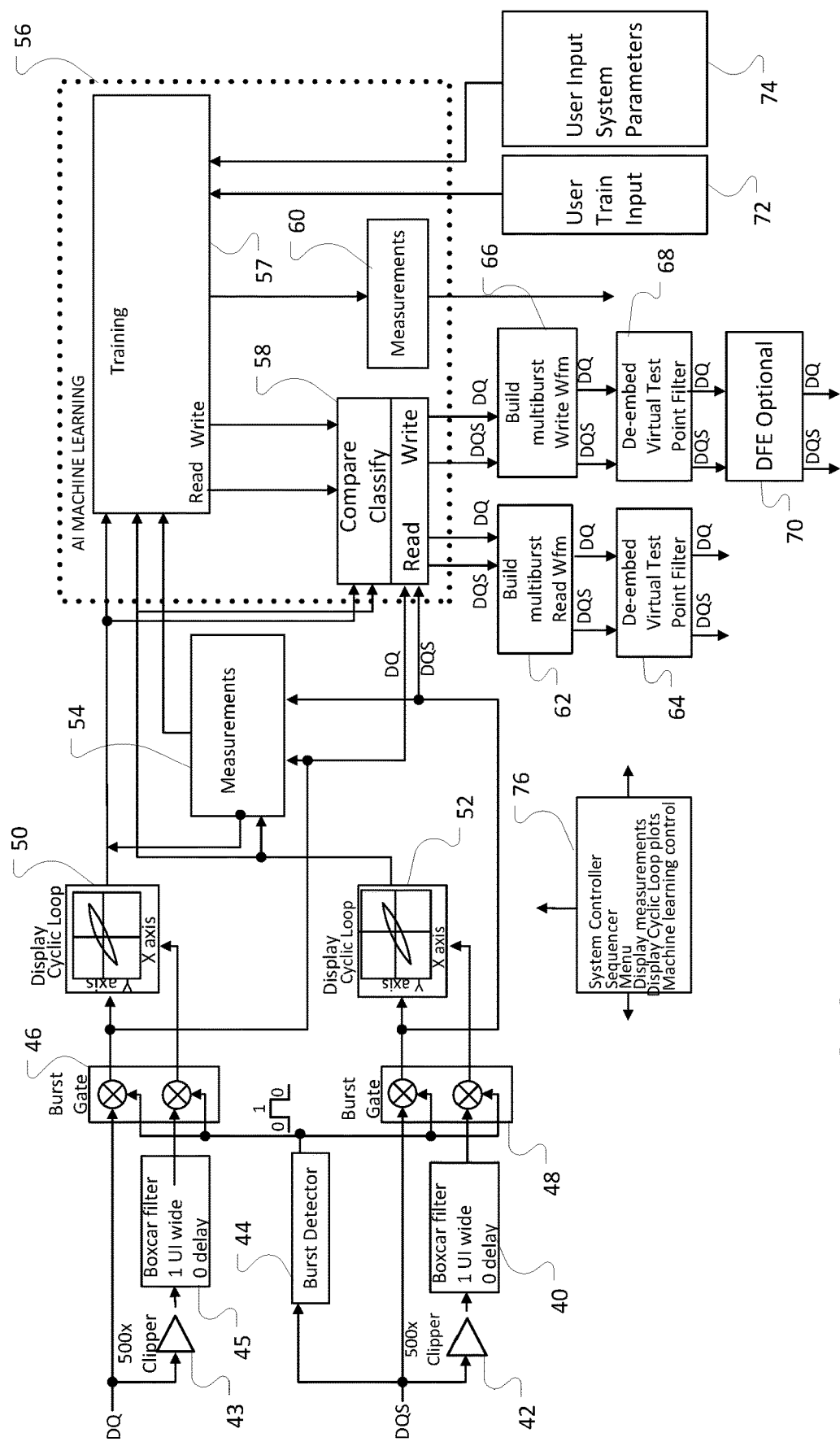
FIG. 8 shows an embodiment of a system for creation and analysis of cyclic loop images.

FIG. 8 shows an embodiment of a system used to classify data burst signals. The system pulse response can be viewed and derived in multiple different ways. For example, the waveform plot of amplitude as a function of time is one way. However, there are disadvantages of giving that view to a machine learning system in the sense of different bit rates, and different data patterns and how to incorporate it. Likewise, the signal can be viewed in the frequency domain and in the cepstrum domain. However, if one attempted to use these views for input to a machine learning systems, there is the problem of having the signal pattern interfere with the view of trying to see the system response. Deconvolution is needed. There are many issues and details that make implementing these views difficult to setup and deal with.

For example, complex clock recovery techniques may be required, and complex gating and interpolation may be required as part of a deconvolution process. There are other issues such as the short reflection delay of the interposer results in resolution issues with cepstrum and spectrum views. Large ISI make it more difficult to extract key features.

The embodiments here resolve the issues involved in these other methods and generate a cyclic loop image that captures all of the edge transitions into a single closed looped XY plot that simply cycles over the same path across the entire length of the input data record. The input data may be a clock signal during a burst interval such as in a DDR5 memory system. The input signal may be a random data pattern such as in DQ burst interval in a DDR5 memory system. While not shown here, the input signal or signals may undergo interpolation or decimation to increase or decrease the number of samples to fill in the resulting image, or to reduce the amount of data used in the artificial intelligence/machine learning system. Reducing the amount of data, often referred to as dimensionality reduction, allows the machine learning system to function more efficiently and accurately. The system may also subtract a mean of the incoming signal from the incoming signal to remove a DC offset from the incoming signal.

As mentioned above, the input signal may be any kind of waveform that has high and low levels with edge transitions with positions determined by a system clock. The X-axis signal is considered to be a linear sweep ramp signal, or a ramp like signal, derived from the input signal. This may be thought of in terms of a standard oscilloscope horizontal sweep ramp. This ramp is synchronized with the input signal directly because it relies on the input signal in generation.

The related patent applications mentioned above detail different approaches to the generation of cyclic loop images and their associated data. For an example of a specific embodiment of cyclic loop image creation, the horizontal sweep ramps are generated by first running the input signal through a circuit that creates a square pulse representation of the input signal, referred to here as a clipper circuit 42, 43. In one embodiment, this circuit multiplies the signal by a large value, e.g. 500, and then if the signal is greater than zero it is assigned to an ideal high value constant that will be same as the input voltage nominal high level. If the signal is less than or equal to zero it is assigned to the low-level constant value. In the embodiment of FIG. 8, the input signal DQ goes through a clipping circuit 43 and the DQS signal goes through a clipper circuit 42.

After the clipping circuit, the signal goes through a short-term integrator 40 and 45. In this embodiment the integrators take the form of boxcar filters. The width of the boxcar filter shall be equal in width to one UI of the input signal. Since there are an integer number of coefficients, it may be the number of coefficients at the given sample rate that is equal to the UI interval, or a fraction of a sample interval less than the UI width. This creates a positive-going ramp-like signal during the time period of positive edges of the input signal, and it creates a negative-going ramp-like signal for time periods during a falling edge of the input signal. For long intervals of multiple UI where there are no edges, there is no ramp, a unique feature of this approach. This results in only positive and negative edge positions appearing in the closed loop path of the cyclic loop image.

All data for multiple UI intervals with no edges is in the image but only at two positions on screen such that only the edges showing the characteristics of the system model are fully visible in a very simple looped path in the image. If the ISI is high then there will be a wider variation of paths followed around the loop. This will cause the center of the cyclic loop to close more. For a clock signal that changes for every UI the entire waveform data set repeatedly traces around the same closed loop path on the XY cyclic loop display. This is also a novel aspect o because all edges are traced along the looping path. This results in the cyclic loop image that does not have a lot of overlays of positive and negative edges that obscures much of the signal detail as in traditional eye diagrams.

The burst detector 44 detects bursts of read and write data. Each burst of data must be detected so that it can be processed and classified as a read or write operation. For DDR5, the burst detection can be accomplished by looking at the DQS clock signal. It stays at zero until a burst starts. There is a preamble of several UI intervals that will have a low for more than one UI in a row. This preamble occurs on the DQS signal. This is the basis for detecting the start of a burst. After that, the DQS signal in the burst alternates between high and low each UI. The DQ signal will contain random highs and lows at each UI interval.

The burst gates 46 and 48 control the data used to produce the cyclic loop image based upon the signal from the burst detector. In the embodiment of FIG. 8, the burst gates comprise a multiplier between the input signal and a 1 or 0 input from the burst detector. The main system controller 76 will sequence the entire system so that only one burst at a time is processed and classified.

The system may create one or two plots, such as 50 and 52, one plot 52 with the acquired DQS on the vertical axis and the sweep ramp output of the clipper and boxcar filter on the horizontal, X axis, applied to the DQS signal. The second plot 50 would have the DQ signal on the Y axis and the sweep ramp created from the cyclic loop algorithm applied to the DQ signal. These two plots may be represented as two relatively low-resolution cyclic loop images which can be used as input to the deep learning neural network to train for classification. These two plots may also be rendered on the display screen for the user to analyze and use to measure various characteristics of the input waveforms, DQ, and DQS. In some embodiments, the system may store the cyclic loop image data in a memory (not shown), and not necessarily render the cyclic loop images on a display.

The system may take multiple measurements using the measurement unit 54, the measurements made from observing the cyclic loop images or the data used to form the cyclic loop images. These measurements may optionally be used as parameter input for part of the machine learning. The values of some of the measurements may be used to identify whether the system model consists of a read or a write. The measurement unit 54 may comprise one or more hardware circuits, software measurement routines, or any combination of hardware and software implementations.

Measurement examples include reflection delay, reflection coefficient, ISI, signal-to-noise ratio (SNR), and non-linearity. The system can obtain the angle between two radial lines from the center of the loop to the correct points on the closed loop for reflection delay. This angle is converted into the time delay of the reflection. Since the rising and falling edges appear in the XY display, the ratio of incident and reflected signals can be measured and the reflection coefficient can be computed. This is most accurate and easy to do when the trace ISI is low. When trace ISI is high it becomes more difficult to tell where to measure from and it becomes less accurate. A relative value of ISI can be obtained by looking at the overall outer diameter of the loop, and the inner diameter of the loop. Some of this will be due to noise. But in a noiseless system, no ISI translates into a single thin line looped path. In contrast, high ISI closes down the loop and widens the loop path thickness.

In addition, from these other measurements, the system can compute the signal to noise ratio. The non-linearity of the transmitter has a different edge shape or slope for falling edges versus rising edges the non-linearity of this will show up readily in the symmetry of the cyclic loop. A measurement can represent this linearity as a single numeric value that can act as input to the machine learning.

Another aspect of the embodiments includes a combination of the measurements into the display image. The various measurements above can act as input parameters for the machine learning. One method for inputting them into the existing trained neural nets that process images is to incorporate them as bar graphs or other formats of digital encoded data into the image. This way the extracted parameters along with the actual waveform image work together to help with the classification process.

The machine learning system 56 receives as input the cyclic loop images. The main purpose of system or network 56 is to look at the cyclic loop images along with any digitally encoded extracted parameters that were placed into the images, then classify the waveform represented in the image to be either a write burst or a read burst. There may be a training phase 57 where multiple examples of read and write cyclic loop images are presented to the network to train it how to classify. After the training period, the input images are analyzed by the trained network and classified as either read or write.

The machine learning system 56 may have the following inputs. The cyclic loop XY plot images show cyclic closed-loop path overlaying all edges into the path. The extracted measurement parameters, if any, are provided inserted in the cyclic loop image, in some other form of a separate image, or as a vector of numbers, or other forms may be devised. When inserted in the image it may be of the form of simple bar graph, or multiple bar graphs, or pi-chart shaped objects, etc. A user input menu 72 would allow the user to look at the cyclic loop images for the acquired bursts and tell the machine which is read, and which is write, for example, as part of training process 57. Once the machine knows which is which it can classify them from that point on in a runtime process 58.

This would be useful for systems which do not have very much difference between read and write, or for which the key model assumptions described above are not the same. For example, there may be no interposer, and the probe may be positioned closer to mid bus where delay for read reflections may be same for write reflections, etc. The system also has a user input menu 74 that allows entry of the various system parameters such as memory load, trace impedance, interposer use and location, etc.

The machine learning system 56 outputs classified data burst signals as either reads or writes. The blocks 66 or 62 creates multiburst waveforms. In one embodiment, this may involve concatenating each detected burst into a single waveform containing only read bursts or write bursts. After the multi-burst waveforms are created, de-embedding filters 64 and 68 may be computed for each waveform. Since the system transfer functions for read versus write are different, there will be a different filter for each waveform. These filters will also move the probe test point at the interposer to a virtual probe test point at the memory or SOC. Optimally, for the DQ signal a DFE equalizer 70 may be applied. The machine learning system 56 may also provide results of the measurements 60.

The system controller 76 may consist of a general-purpose processor which controls and sequences the entire system, or a processor on the test and measurement device, or distributed between them. The system controller may also be distributed across several processors, cloud computing, etc. The processors may be configured to execute code that causes the processors to provide all the processing functions, for measurements and the neural network or other types of machine learning that may be employed. Obviously, any part of this system may be implemented on other types of processors such as ASICs, GPUs, FPGAs, etc.

Figure 9:
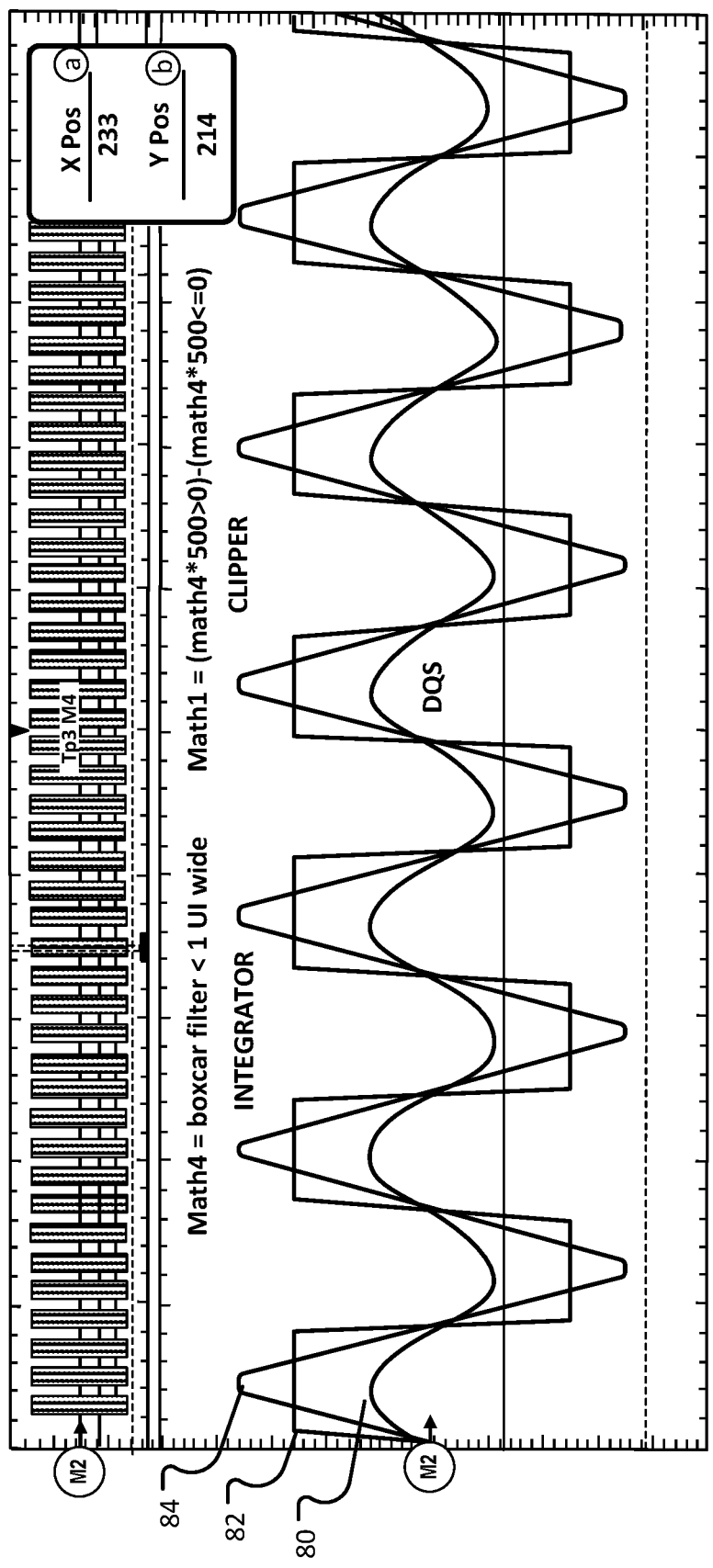
FIG. 9 shows an example of an oscilloscope screen of the waveforms used for creating a cyclic loop diagram.

FIG. 9 shows examples on an oscilloscope screen of the waveforms used for making the cyclic loop image. In this view the somewhat sinusoidal looking waveform is a DQS clock signal 80. The output of the clipper is shown as a square wave 82. The ramp signal is the output of the boxcar filter at 84.

Figure 10:
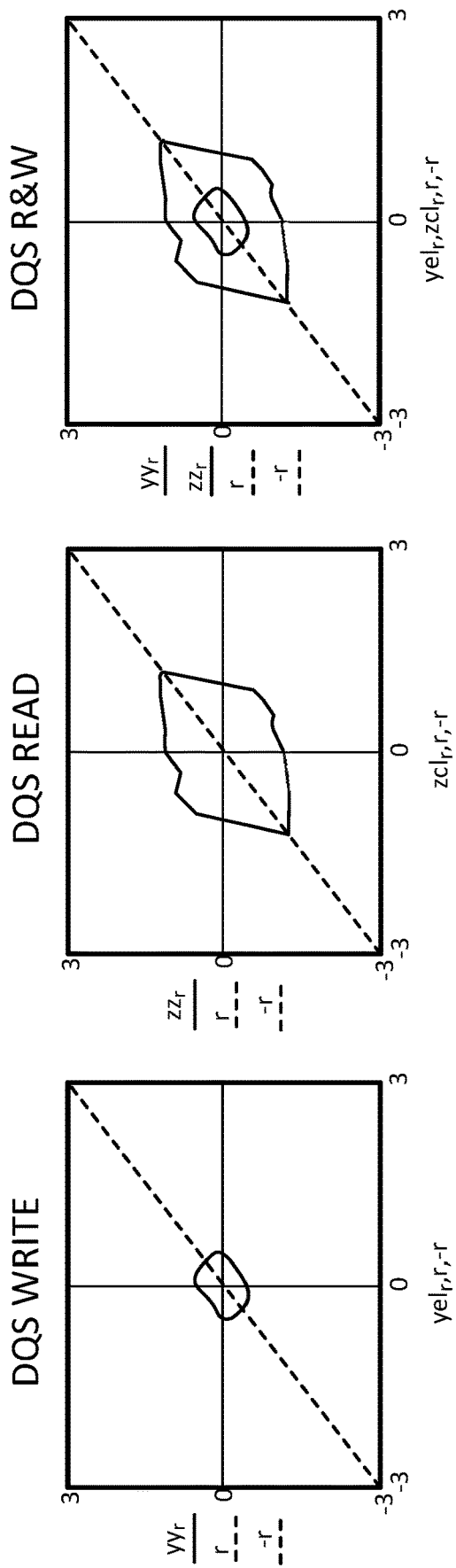
FIG. 10 shows examples of cyclic loop images.
Figure 11:
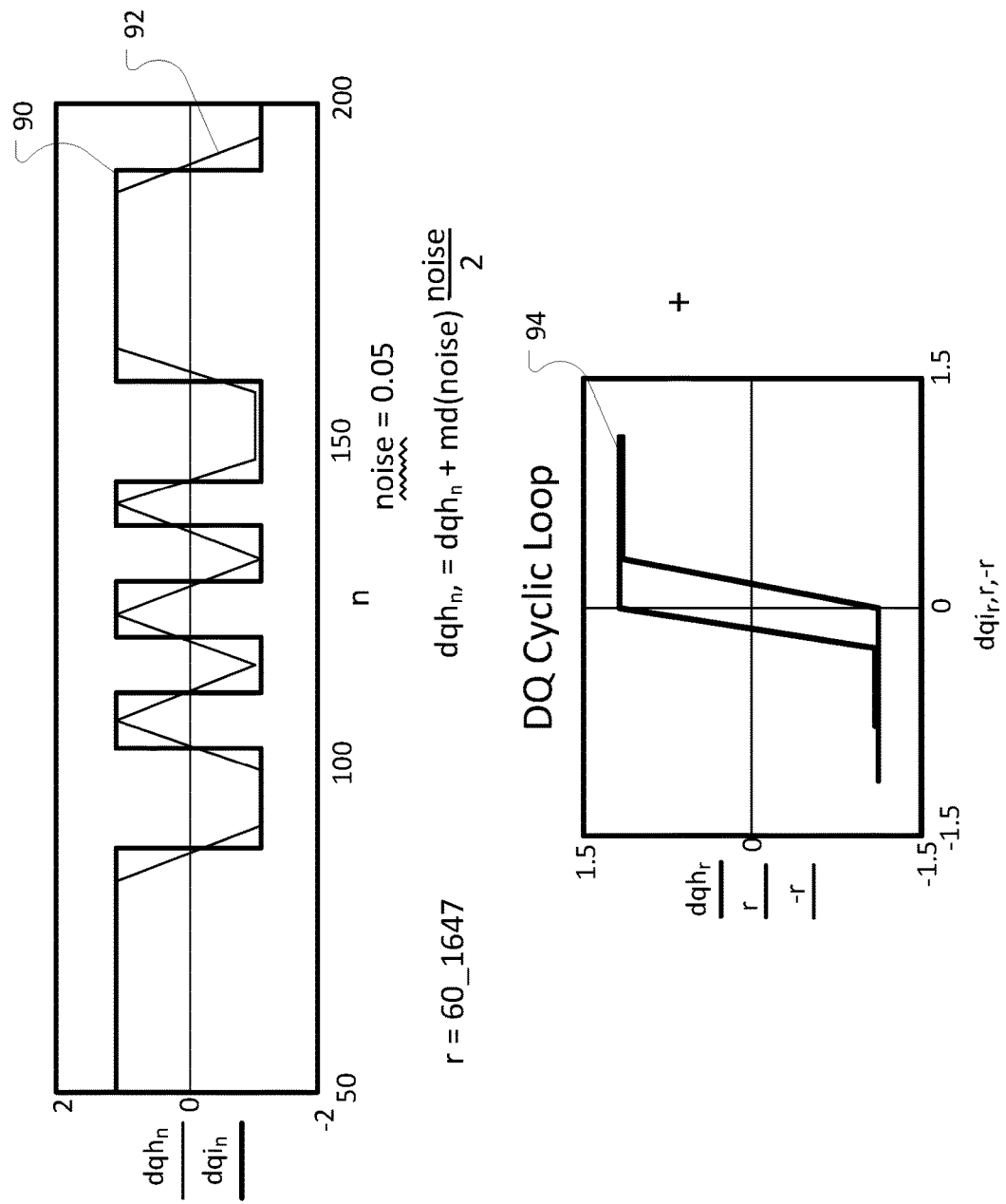
FIG. 11 shows an example of a DQ random data signal with no reflections and no ISI and the resulting cyclic loop image.

FIG. 10 shows examples of cyclic loop images. At left is a high ISI DQS write signal. In the middle is a DQS read signal where reflections are visible. At the right is an overlay of both DQS read and write. FIG. 11 shows an example of DQ random pulse levels 90 and the associated ramp sweep signal 92 with ramps that only occur during the edge transitions of the DQ signal, and the cyclic loop image 94 constructed from the DQ signal 90 and the ramp sweep signal 92.

Figure 12:
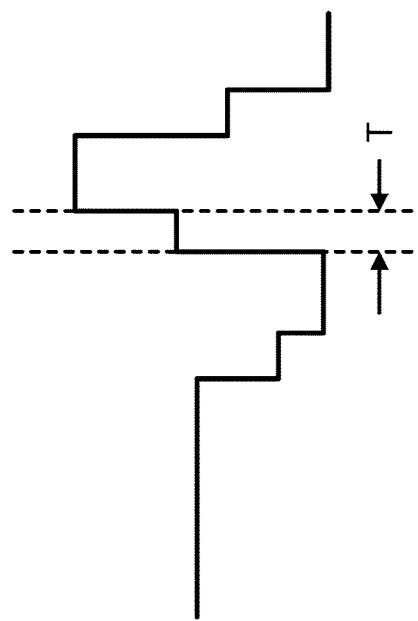
FIG. 12 shows an example of a measurement from a standard YT trace display.

The reflection delay between probe and memory load, may be measured from a standard YT trace display as shown in FIG. 12. The trace delay is then computed from (7) as:

$$\text{Delay} = T/2 \tag{7}$$

Figure 13:
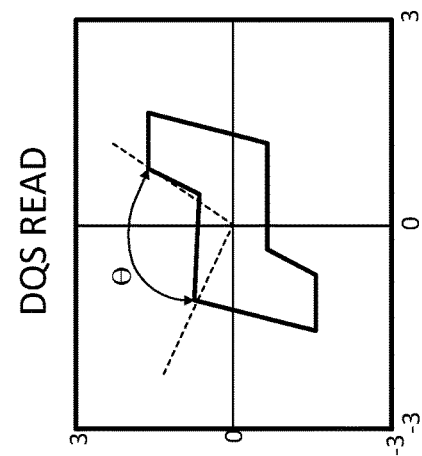
FIG. 13 shows an example of measuring reflection delay.
Figure 13:
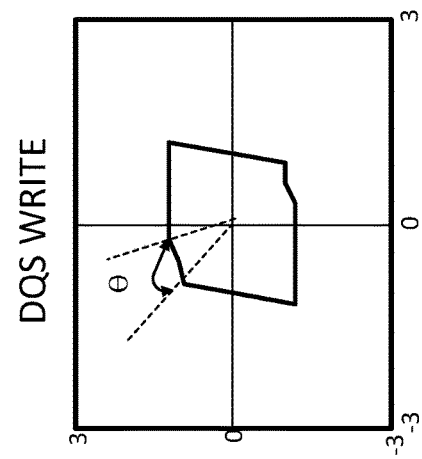

FIG. 13 shows how to measure the trace delay using the cyclic loop image, where delay is represented as $\theta$ in degrees. For both cases the waveform is shown with no trace ISI loss in order to simplify the view to show the points at which to measure a phase angle, $\theta$, in order to compute the reflection delay time.

The delay time may be computed from the (8). One full path thru the loop is 360 degrees which is one cycle. One cycle is two UI or two bits for an NRZ type signal.

$$\text{delay} = \frac{\theta}{360 \cdot \text{bitRate}} \tag{6}$$

where $\theta$ is in degrees and delay has units of seconds. The data rate of the signal is the bitrate for an NRZ type signal.

Figure 14:
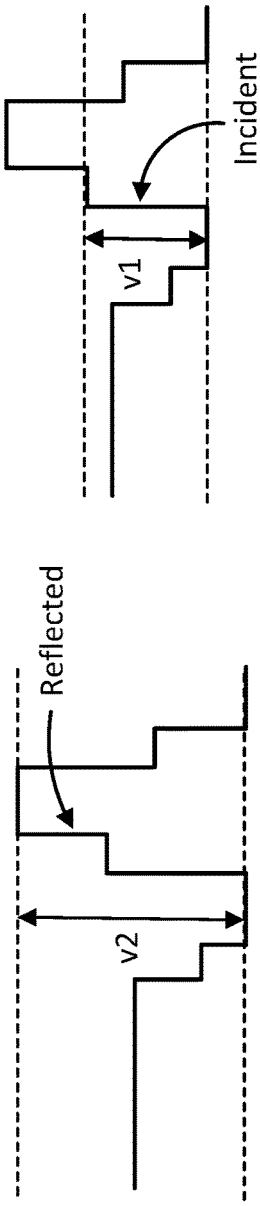
FIG. 14 shows examples of measuring coefficients.

A reflection coefficient for the short trace between probe and memory can be measured on a standard YT type of waveform display as shown in FIG. 14. The reflection coefficient is then computed as:

$$\Gamma = (v2 - v1)/v1$$

Once the reflection coefficient is known the impedance of the load, Z, or the characteristic impedance Z0 can be computed if one of them is known.

$$Z = Z_0 \cdot (1+\Gamma)/(1-\Gamma)$$

Figure 15:
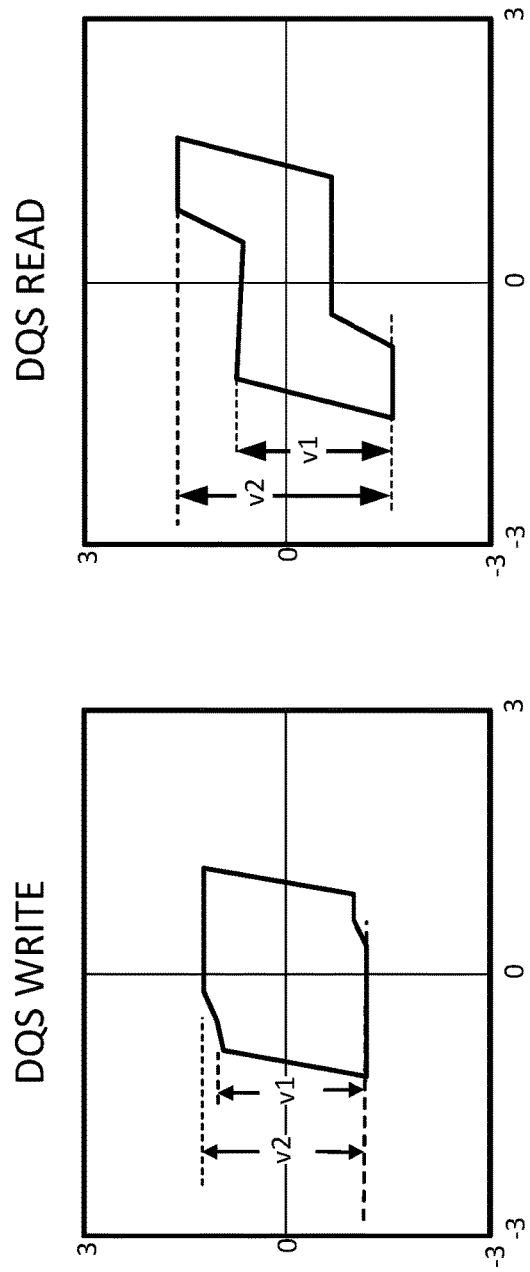
FIG. 15 shows an example of measuring reflection coefficients using the cyclic loop diagram.

The reflection coefficient may be measured using the cyclic loop image as shown below in FIG. 15.

In this manner, the system can create and use new cyclic loop images, and optionally include measurement encoded bar graphs in the images. These images are then used in a deep learning environment to determine and classify the nature of the signals by separating them and classifying them for analysis and other uses.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Examples

Illustrative examples of the disclosed technologies are provided below. An embodiment of the technologies may include one or more, and any combination of, the examples described below.

Example 1 is a system to classify signals, comprising: an input to receive incoming waveform data; a memory; and one or more processors configured to execute code to cause the one or more processors to: generate a ramp sweep signal from the incoming waveform data; locate a data burst in the incoming waveform data using a burst detector; receive a signal from the burst detector to cause the memory to store cyclic loop image data in the form of the incoming waveform data as y-axis data and the ramp sweep signal as x-axis data; and employ a machine learning system to receive the cyclic loop image data and classify the data burst.

Example 2 is the system of Example 1, further comprising a test and measurement instrument to acquire the incoming waveform data from a device under test.

Example 3 is the system of either Examples 1 or 2, wherein the code to cause the one or more processors to generate the ramp sweep signal from the incoming waveform data further comprises code to cause the one or more processors to: use a clipper to generate a square pulse signal from the incoming waveform data; and use an integrator to generate ramp signals based upon the square pulse signal and transmit the ramp signals to the burst gate.

Example 4 is the system of Example 3, wherein the integrator comprises a boxcar filter.

Example 5 is the system of any of the Examples 1-4, further comprising a measurement unit to take a measurement using the cyclic loop image data.

Example 6 is the system of Example 5, wherein the measurement includes one or more of reflection delay, reflection coefficient, intersymbol interference, signal-to-noise ratio, and non-linearity.

Example 7 is the system of Example 5, wherein the measurement unit sends the measurement to the machine learning system.

Example 8 is the system of any of Examples 1-7, further comprising a concatenator to create a multi-burst waveform from the classified data burst from the machine learning system.

Example 9 is the system of Example 8, further comprising a filter to apply to the multi-burst waveform.

Example 10 is the system of any of Examples 1-9, further comprising a system controller to coordinate operations of the system.

Example 11 is a method of classifying signals, comprising: generating a ramp sweep signal from incoming waveform data; locating a data burst in the incoming waveform data; storing cyclic loop image data for the data burst in the form of the incoming waveform data as Y-axis data and the ramp sweep signal as X-axis data; and using a machine learning system to receive the cyclic loop image and classify the data burst.

Example 12 is the method of Example 11, further comprising receiving system parameters from a user.

Example 13 is the method of either of Examples 11 or 12, wherein generating the ramp sweep signal comprises: generating a square pulse signal from the incoming waveform data; and integrating the square pulse signal to produce the ramp sweep signal.

Example 14 is the method of Example 13, wherein integrating the square pulse signal is performed by a boxcar filter.

Example 15 is the method of any of the Examples 11-14, further comprising taking a measurement using the cyclic loop image data.

Example 16 is the method of Example 15, wherein the taking the measurement includes measuring one or more of reflection delay, reflection coefficient, intersymbol interference, signal-to-noise ratio, and non-linearity.

Example 17 is the method of Example 15, further comprising sending the measurement to the machine learning system, wherein the machine learning system classifies the data burst using the cyclic loop image data and the measurement.

Example 18 is the method of any of the Examples 11-17, further comprising creating a multiburst waveform from classified data bursts from the machine learning system.

Example 19 is the method of any of the Examples 11-18, further comprising training the machine learning system, the training comprising: providing a set of cyclic loop images; receiving user inputs that classify each cyclic loop image; testing the machine learning system by having the machine learning system provide a classification and verifying the classification against the user input; and repeating the testing until the machine learning system correctly classifies the cyclic loop images.

Example 20 is a system to classify data signals, comprising: a ramp generator to generate a ramp sweep signal from incoming waveform data; a burst detector to locate a data burst in the incoming waveform data; a burst gate to receive a signal from the burst detector and cause a memory to store cyclic loop image data in the form of the incoming waveform data as y-axis data and the ramp sweep signal as x-axis data; and a machine learning system to receive the cyclic loop image and classify the data burst.

Example 21 is the system of Example 20, wherein the incoming waveform data is acquired from a memory device under test, and wherein the machine learning system classifies the data burst as resulting from one of a write operation or a read operation for the memory device under test.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A system to classify signals, comprising:
    an input to receive incoming waveform data;
    a memory; and
        one or more processors configured to execute code to cause the one or more processors to:
            generate a ramp sweep signal from the incoming waveform data;
            locate a data burst in the incoming waveform data using a burst detector;
            receive a signal from the burst detector to cause the memory to store cyclic loop image data in the form of the incoming waveform data as y-axis data and the ramp sweep signal as x-axis data; and
            employ a machine learning system to receive the cyclic loop image data and classify the data burst.

2. The system as claimed in claim 1, further comprising a test and measurement instrument to acquire the incoming waveform data from a device under test.

3. The system as claimed in claim 1, wherein the code to cause the one or more processors to generate the ramp sweep signal from the incoming waveform data further comprises code to cause the one or more processors to:
    use a clipper to generate a square pulse signal from the incoming waveform data; and
    use an integrator to generate ramp signals based upon the square pulse signal and transmit the ramp signals to the burst gate.

4. The system as claimed in claim 3, wherein the integrator comprises a boxcar filter.

5. The system as claimed in claim 1, further comprising a measurement unit to take a measurement using the cyclic loop image data.

6. The system as claimed in claim 5, wherein the measurement includes one or more of reflection delay, reflection coefficient, intersymbol interference, signal-to-noise ratio, and non-linearity.

7. The system as claimed in claim 5, wherein the measurement unit sends the measurement to the machine learning system.

8. The system as claimed in claim 1, further comprising a concatenator to create a multi-burst waveform from the classified data burst from the machine learning system.

9. The system as claimed in claim 8, further comprising a filter to apply to the multi-burst waveform.

10. The system as claimed in claim 1, further comprising a system controller to coordinate operations of the system.

11. A method of classifying signals, comprising:
    generating a ramp sweep signal from incoming waveform data;
    locating a data burst in the incoming waveform data;
    storing cyclic loop image data for the data burst in the form of the incoming waveform data as Y-axis data and the ramp sweep signal as X-axis data; and
    using a machine learning system to receive the cyclic loop image and classify the data burst.

12. The method as claimed in claim 11, further comprising receiving system parameters from a user.

13. The method as claimed in claim 11, wherein generating the ramp sweep signal comprises:
   generating a square pulse signal from the incoming waveform data; and
   integrating the square pulse signal to produce the ramp sweep signal.

14. The method as claimed in claim 13, wherein integrating the square pulse signal is performed by a boxcar filter.

15. The method as claimed in claim 11, further comprising taking a measurement using the cyclic loop image data.

16. The method as claimed in claim 15, wherein the taking the measurement includes measuring one or more of reflection delay, reflection coefficient, intersymbol interference, signal-to-noise ratio, and non-linearity.

17. The method as claimed in claim 15, further comprising sending the measurement to the machine learning system, wherein the machine learning system classifies the data burst using the cyclic loop image data and the measurement.

18. The method as claimed in claim 11, further comprising creating a multiburst waveform from classified data bursts from the machine learning system.

19. The method as claimed in claim 11, further comprising training the machine learning system, the training comprising:
   providing a set of cyclic loop images;
   receiving user inputs that classify each cyclic loop image;
   testing the machine learning system by having the machine learning system provide a classification and verifying the classification against the user input; and
   repeating the testing until the machine learning system correctly classifies the cyclic loop images.

20. A system to classify data signals, comprising:
   a ramp generator to generate a ramp sweep signal from incoming waveform data;
   a burst detector to locate a data burst in the incoming waveform data;
   a burst gate to receive a signal from the burst detector and cause a memory to store cyclic loop image data in the form of the incoming waveform data as y-axis data and the ramp sweep signal as x-axis data; and
   a machine learning system to receive the cyclic loop image and classify the data burst.

21. The system as claimed in claim 20, wherein the incoming waveform data is acquired from a memory device under test, and wherein the machine learning system classifies the data burst as resulting from one of a write operation or a read operation for the memory device under test.

* * * * *